(12) United States Patent
Vishinsky

(10) Patent No.: US 10,291,226 B1
(45) Date of Patent: May 14, 2019

(54) SAMPLE-AND-HOLD CIRCUIT WITH ENHANCED NOISE LIMIT

(71) Applicant: IQ-Analog Corporation, San Diego, CA (US)

(72) Inventor: Adam Vishinsky, Little Elm, TX (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 16/143,654

(22) Filed: Sep. 27, 2018

(51) Int. Cl.
| H03K 5/00 | (2006.01) |
| H03K 17/687 | (2006.01) |
| G11C 27/02 | (2006.01) |
| H03M 1/12 | (2006.01) |
| H02M 1/00 | (2006.01) |

(52) U.S. Cl.
CPC ......... *H03K 17/6872* (2013.01); *G11C 27/02* (2013.01); *H03M 1/124* (2013.01); *H02M 2001/0009* (2013.01)

(58) Field of Classification Search
None
See application file for complete search history.

(56) References Cited

U.S. PATENT DOCUMENTS

| 5,841,310 | A | 11/1998 | Kalthoff et al. |
| 5,926,060 | A | 7/1999 | Olgaard et al. |
| 6,285,309 | B1 | 9/2001 | Yu |
| 7,038,431 | B2 * | 5/2006 | Benbrik .......... G05F 3/262 323/273 |
| 7,636,075 | B2 | 12/2009 | Shin |
| 7,696,819 | B2 | 4/2010 | Cho et al. |
| 8,000,789 | B2 | 8/2011 | Denison |
| 8,352,030 | B2 | 1/2013 | Denison |
| 8,952,729 | B2 | 2/2015 | Fowler et al. |
| 9,391,628 | B1 | 7/2016 | Lyden et al. |
| 9,525,426 | B2 | 12/2016 | Stojanovic et al. |
| 9,660,662 | B2 | 5/2017 | Venca et al. |
| 9,705,521 | B1 | 7/2017 | Monk et al. |

(Continued)

OTHER PUBLICATIONS

Pirola et al., "Current-Mode, WCDMA Channel Filter With In-Band Noise Shaping", IEEE Journal of Solid-State Circuits, vol. 45, No. 9, pp. 1770-1780, Sep. 2010.*

(Continued)

*Primary Examiner* — Long Nguyen
(74) *Attorney, Agent, or Firm* — Law Office of Gerald Maliszewski; Gerald Maliszewski

(57) ABSTRACT

A sample-and-hold circuit is presented that is current driven at the input and current sensed at the output, using two capacitors—one at the input to the ground and second past a pair of complementary CMOS switches at the output to the ground. These capacitors in connection with an input current drive form a highpass noise transfer function that substantially reduces the 1/f noise of the switches and then rolls the transfer function off, further reducing the noise. The overall noise level is significantly lower as compared to a conventional voltage-driven and voltage-sensed sample-and-hold circuit that has a lowpass transfer function which, after integration, demonstrates a noise limit of kT/C. Depending on the circuit parameters the present sample-and-hold circuit shows an integrated noise improvement of between 5 and 10 dB over kT/C limit.

13 Claims, 4 Drawing Sheets

(56) References Cited

U.S. PATENT DOCUMENTS

| | | |
|---|---|---|
| 9,722,746 B2 | 8/2017 | Ho et al. |
| 10,003,348 B2 | 6/2018 | Liu |
| 2005/0029995 A1* | 2/2005 | Benbrik .................. G05F 3/262 |
| | | 323/282 |

OTHER PUBLICATIONS

Ølgaard, C., Sassene, H., & Perch-Nielsen, I. R. "An area efficient low noise 100 Hz low-pass filter". International Symposium on Circuits and Systems 1996.

Liscidini A., Pirola R., Castello R., "A 1.25mW 75dB-SFDR CT filter with in-band noise reduction", IEEE International Solid-State Circuits Conference, ISSCC 2009.

A. Pirola, A. Liscidini, and R. Castello, "Current-mode, WCDMA channel filter with in-band noise shaping" IEEE Journal of Solid-State Circuits, vol. 45, No. 9, pp. 1770-1780, 2010.

S. D'Amico, V. Giannini, and A. Baschirotto, "A 4th-order active Gm-RC reconfigurable (UMTS/WLAN) filter" IEEE Journal of Solid-State Circuits, vol. 41, No. 7, pp. 1630-1637, 2006.

S. D'Amico et al., "A 4.1-mW 10-MHz fourth-order source-follower-based continuous-time filter with 79-dB DR," IEEE J. Solid-State Circuits, vol. 41, No. 12, pp. 2713-2719, 2006.

R. Kapusta, H. Zhu, and C. Lyden, "Sampling circuits that break the kT/C thermal noise limit," in Proc. IEEE Custom Integrated Circuits Conference, 2013, pp. 1-6.

R. Kapusta, H. Zhu, and C. Lyden, "Sampling Circuits that Break the kT/C Thermal Limit", IEEE Journal of Solid-State Circuits, vol. 49, No. 8, Aug. 2014, pp. 1694-1701.

* cited by examiner

SAMPLE-AND-HOLD CIRCUIT WITH ENHANCED NOISE LIMIT

BACKGROUND OF THE INVENTION

1. Field of the Invention

The present invention generally relates to sample-and-hold circuits, such as those utilized at the front of analog to digital converters and, more particularly, to a sample-and-hold circuit that is current driven at the input and current sensed at the output.

2. Description of the Related Art

Sample-and-hold (S/H) circuits are used to provide discrete signal values, necessary at the input of an analog to digital converter (ADC). One of the most important parameters of a S/H circuit is the amount of thermal noise it generates. This value often determines the necessary resolution, or necessary number of bits required for an ADC. Conventionally, the majority of S/H circuits are voltage-driven at the input and voltage-sensed at the output. For such a circuit its frequency response is a one-pole low-pass filter with pole value at $f=1/(2\pi \cdot R_{ON} \cdot C)$, where f is the pole frequency, $R_{ON}$ is the switch on-resistance, and C is the value of a sampling capacitor. If this noise is integrated over the S/H bandwidth, its value is kT/C, where k is the Boltzmann constant and T is the Kelvin temperature.

In recent years this value has been an undisputed limit of S/H thermal noise performance. However, a need has developed to lower the amount of S/H thermal noise in order to limit the number of required ADC bits, which may result in a smaller ADC footprint and its reduced power consumption.

It would be advantageous if a S/H circuit existed having a lowpass signal transfer function and a highpass noise transfer function with the potential of lowering thermal noise below the kT/C value.

SUMMARY OF THE INVENTION

A sample and hold (S/H) circuit is provided herein that is current driven at the input and current sensed at the output. A first capacitor, to ground, is connected at the input to a pair of complementary metal-oxide-semiconductor (CMOS) switches, and a second (optional) capacitor, to ground, is connected to CMOS switch output. Optionally, a single field effect transistor (FET) may be used as the switch. The first capacitor, in cooperation with an input current drive, forms a highpass noise transfer function that substantially reduces the 1/f (flicker) noise of the switch(es). The second capacitor helps improve the noise transfer rolls-off further, reducing the overall noise. The overall noise level is significantly lower than a conventional voltage-driven and voltage-sensed sample-and-hold circuit that has a lowpass transfer function and that after integration demonstrates a noise limit of kT/C, where k is the Boltzmann constant, T is the absolute temperature in Kelvin, and C is a value of a sampling capacitor. Depending on the circuit parameters, the sample-and-hold circuit presented herein shows an integrated noise improvement of between 5 and 10 decibels (dB) below the kT/C limit.

Accordingly, a sample-and-hold circuit with an enhanced noise limit is provided. The S/H circuit uses at least a first field effect transistor (FET) having a first source drain (S/D) to accept an analog input signal current ($I_S$), a second S/D, and a gate to accept a binary level first digital control signal. A source resistance (Rs), represented schematically as source resistor ($R_S$), has a first terminal connected to the first S/D of the first FET and a second terminal connected to ground. A first capacitor ($C_1$) has a first terminal connected to the first S/D of the first FET and a second terminal connected to ground. As a result, the second S/D of the first FET presents a current-sensed analog output signal ($I_O$) in response to the first digital control signal enabling the first FET at a first time. In one aspect, a second capacitor has a first terminal connected to the second S/D of the first FET and a second terminal connected to the reference voltage. As mentioned above, in another aspect a complementary second FET has a second S/D connected to the first S/D of the first FET, a first S/D connected to the second S/D of the first FET, and a gate to accept a binary level second digital control signal, complementary to the first digital control signal. The second digital control signal enables the second FET at the first time.

Additional details of the above-described current-mode S/H circuit are presented below.

DETAILED DESCRIPTION

Figure 1A:
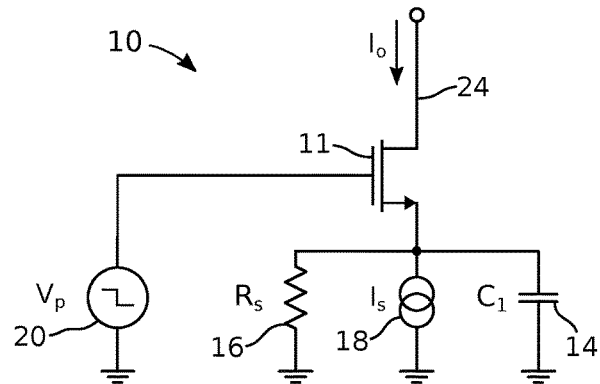
FIGS. 1A and 1B are schematic diagrams of a current-driven, current-sensed sample- and hold-circuit using, respectively, a single FET and complementary switches.
Figure 1B:
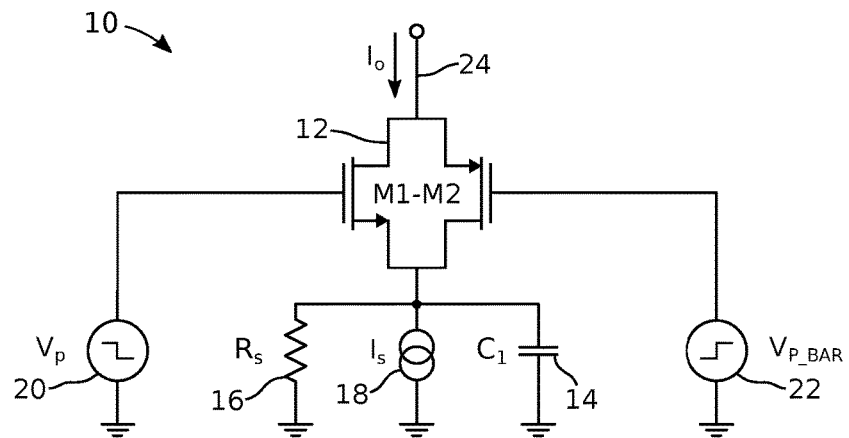

FIGS. 1A and 1B are schematic diagrams of a current-driven, current-sensed sample and hold circuit using, respectively, a single FET and complementary switches. The sample-and-hold (S/H) circuit 10 uses a switch enabled with a single field effect transistor (FET) 11, as shown in FIG. 1A, or enabled with a pair of complementary switches 12 (e.g., FETs such as complementary metal-oxide-semiconductor CMOS transistors), as shown in FIG. 1B. The switch or switches are connected to the input capacitor $C_1$ 14 through their input source/drain (S/D) terminals. The complementary switch 12 does not change the noise performance, but it substantially improves the linearity. Switch 11 or 12 is excited by an input analog signal current source 16 with a source resistance (Rs), represented as source resistor $R_S$ 18, between the FET (FIG. 1A) or FETS (FIG. 1B) and ground.

Furthermore, the gate of switch 11 (FIG. 1A) is pulsed with binary value digital voltage source $V_p$ 20, and the gates of switch 12 (FIG. 1B) are pulsed by two complementary digital voltage sources $V_P$ and $V_{P\_BAR}$ denoted, respectively, by reference designators 20 and 22. The digital voltage source enables the switch(es) to selectively pass current or prevent current flow. The output current $I_O$ on line 24 is on the other side of the switch 11 (FIG. 1A) or switches 12 (FIG. 1B), away from the $C_1$ capacitor 14.

Figure 2:
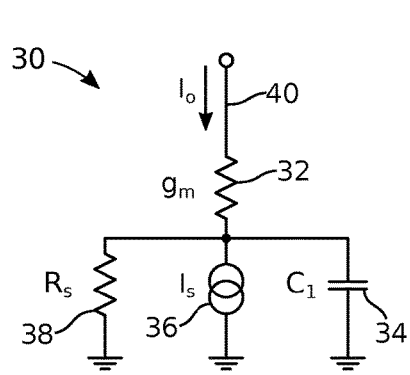
FIG. 2 is a schematic diagram of the S/H current-mode circuit with ideal components supporting the derivation of the signal transfer function.

FIG. 2 is a schematic diagram of the S/H current-mode circuit with ideal components supporting the derivation of the signal transfer function. The model 30 consists of 4 elements only. The transconductance of the FET in FIG. 1A or the complementary switches in FIG. 1B is denoted by $g_m$ and is identified by reference designator 32. Capacitance $C_1$ is identified by reference designator 34, and a signal source $I_S$ with a signal source resistance (Rs), represented schematically as input or source resistor $R_S$, are respectively identified by the reference designators 36 and 38. Finally, the output current $I_O$ is identified with the reference designator 40 and it is taken on the opposite side of the transistor(s) from capacitor 34.

The current signal transfer function of the current-mode S/H of FIGS. 1A and 1B is $I_O/I_S=g_m/(g_m+sC_1)$, which is a first-order lowpass function.

$$I_S = I_{Rs} + I_{C1} + I_{gm}$$
$$= V_S * (1/R_S + g_m + sC_1)$$
$$= (I_O/g_m) * (1/R_S + g_m + sC_1)$$
$$I_O/I_S = g_m/(1/R_S + g_m + sC_1)$$
If $1/R_S \ll g_m => I_{Rs} \approx 0$
$$I_O/I_S = g_m/(g_m + sC_1)$$

where $C_1$ is the capacitance value of $C_1$; and,
where Rs is the resistance value of Rs.

Figure 3:
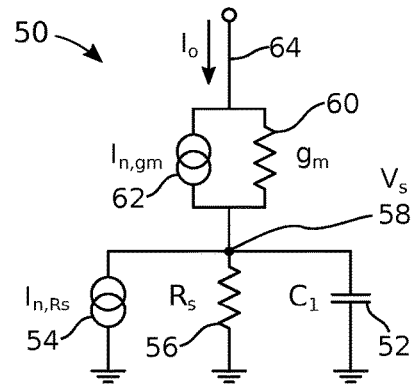
FIG. 3 is a schematic diagram of the S/H current-mode circuit with ideal components supporting the derivation of the noise transfer function.

FIG. 3 is a schematic diagram of the S/H current-mode circuit with ideal components supporting the derivation of the noise transfer function. The model 50 comprises the transconductance of the FET (FIG. 1A) or the complementary switches (FIG. 1B), denoted by $g_m$ and identified by the reference designator 60. A switch noise current source is denoted by $I_{n,gm}$ and identified by reference designator 62. Capacitance $C_1$ is identified by reference designator 52, and the signal source $I_S$ with the source resistance (Rs), as represented schematically by source resistance $R_S$, are respectively identified by the reference designators 54 and 56. The voltage $V_S$ at the current input of the transistors is identified with reference designators 58. Finally, the output current $I_O$ is identified with reference designator 64 and it is taken on the opposite (current-sensed) side of switch(es) from capacitor 52.

Figure 8:
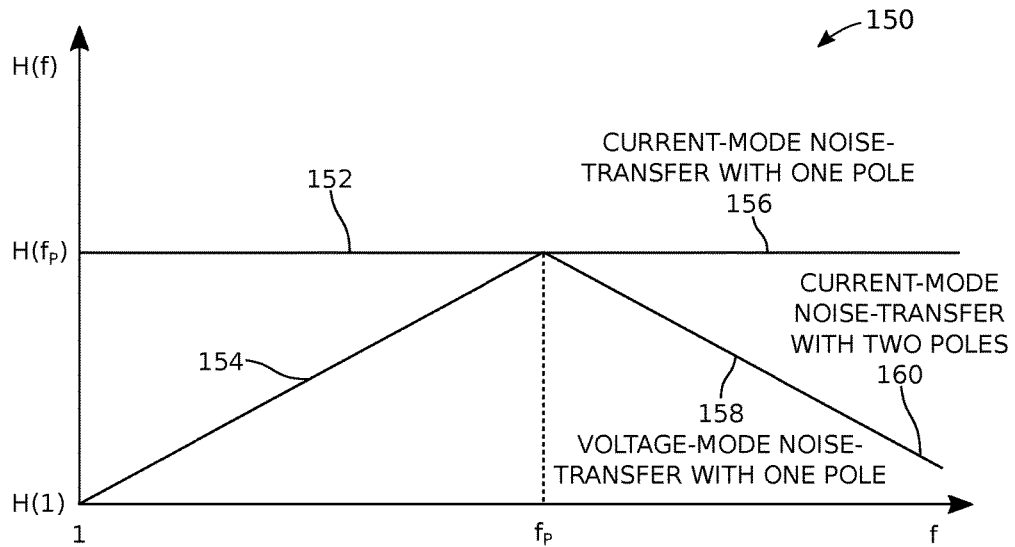
FIG. 8 is a graph contrasting two noise transfer functions.

The current noise transfer function of the S/H circuit is $I_O/I_{n,gm}=sg_mC_1/(g_m+sC_1)$, which is a first-order highpass function. The combined transfer function that uses noise transfer in combination with signal transfer is calculated to be $(I_O/I_{n,gm})*(I_O/I_S)=sC_1/(g_m+sC_1)*g_m/(g_m+sC_1)=sg_mC_1/(g_m+sC_1)^2$. This function has a zero at dc—(zero Hertz) and a double pole at $g_m/C_1$. As it is shown in FIG. 8, one pole compensates for zero and the transfer is flat after pole frequency $g_m/C_1$. However, second pole gives the transfer a desired drop-off after the double-pole frequency $g_m/C_1$.

$$I_O = I_{n,Rs} + I_{Rs} + I_{C1} - I_{n,gm} + I_{gm}$$
$$= I_{n,Rs} - I_{n,gm} + V_S * (1/R_S + g_m + sC_1)$$

If $1/R_S \ll g_m => I_{n,Rs} + I_{Rs} \approx 0$

Also, at high frequency $I_O \approx I_{C1}$ and $I_{n,gm} \approx I_{gm} + I_{C1}$ $$I_O/I_n = I_{C1}/(I_{gm} + I_{C1})$$
$$= V_S * sC_1/(g_m + sC_1) * V_S$$
$$= sC_1/(g_m + sC_1)$$

Combined noise transfer function:

$$(I_O/I_{n,gm})*(I_O/I_S) = sC_1/(g_m + sC_1)*g_m/(g_m + sC_1)$$
$$= sg_msC_1/(g_m + sC_1)^2$$

Figure 4:
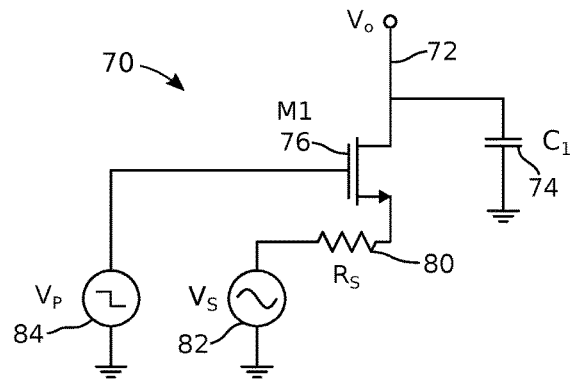
FIG. 4 is a schematic diagram of a voltage-mode sample and hold test-bench circuit.

FIG. 4 is a schematic diagram of a voltage-mode sample and hold test-bench circuit. The voltage-mode S/H circuit 70 includes a single switch M1, as shown here in the interest of simplicity, but may alternatively be a pair of complementary switches such as shown in FIG. 1B. M1 is identified by reference designator 76 and is connected to an output capacitor $C_1$ 74. Switch 76 is excited by an input analog signal voltage source 82 with a source resistance (Rs), represented schematically by source resistor $R_S$ 80. Additionally, the switch 76 is pulsed from a digital voltage source 84. Two voltages are present in this circuit: the input voltage $V_S$ 82 and the output voltage $V_O$ 72. The derivation of transfer functions is easier if the voltage signal source 82 is replaced a current source, as described in the explanation of FIG. 5 below.

Figure 5:
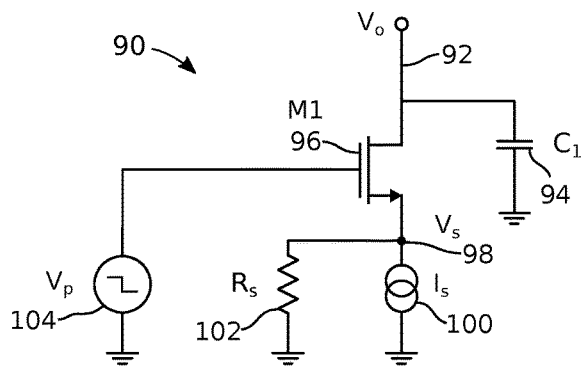
FIG. 5 is a schematic diagram of the voltage-sensed circuit driven by a signal current source.

FIG. 5 is a schematic diagram of the voltage-sensed circuit driven by a signal current source. The voltage-mode S/H circuit 90 of FIG. 5 is derived from the circuit of FIG. 4. It includes a single switch M1 96 that is connected to an output capacitor $C_1$ 94. Switch 96 is excited by an input analog signal current source 100 with a source resistance (Rs), represented schematically by source resistor $R_S$ 102. Additionally, the switch 96 is pulsed from a digital voltage source 104. Two voltages are present in this circuit: the input voltage $V_S$ 98 and the output voltage $V_O$ 92.

Figure 6:
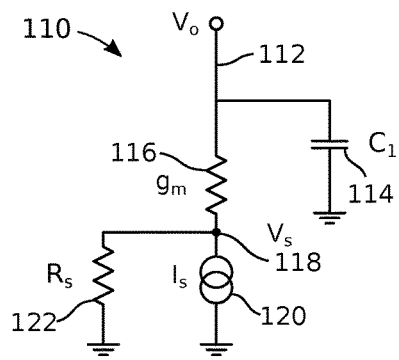
FIG. 6 is a schematic diagram of the voltage-sensed, current-driven circuit supporting the derivation of a voltage transfer function.

FIG. 6 is a schematic diagram of the voltage-sensed, current-driven circuit supporting the derivation of a voltage transfer function. The model 110 comprises 4 elements only. The transconductance of the switch 96 is denoted by $g_m$ and identified with reference designator 116. The model 110 also comprises capacitance $C_1$ 114, signal source $I_S$ 120, and source resistance (Rs), represented schematically by source resistor $R_S$ 122. Finally, the output voltage $V_O$ 112 and it is taken on the opposite side of the switch from capacitor 114. Additionally, the input voltage $V_S$ is identified with reference designator 118.

The voltage signal transfer function of the voltage-mode S/H is $V_O/V_S=g_m/(g_m+sC_1)$, which is a first-order lowpass function.

$$I_S + I_{Rs} = I_{gm}$$
$$I_S + V_S/R_S = (V_S - V_O)*g_m$$

-continued $$I_S = V_S * (1/R_S + g_m) - V_O * g_m$$

If $1/R_S \ll g_m => I_{Rs} \approx 0$ $$I_{C1} = V_O * sC_1 = I_S$$

$$I_S = V_S * g_m - (I_S/sC_1) * g_m$$

$$I_S + (I_S/sC_1) * g_m = V_S * g_m$$

$$I_S * (1 + g_m/sC_1) = V_S * g_m$$

$$V_O * sC_1 * (1 + g_m/sC_1) = V_S * g_m$$

$$V_O/V_S = g_m/(g_m + sC_1)$$

Figure 7:
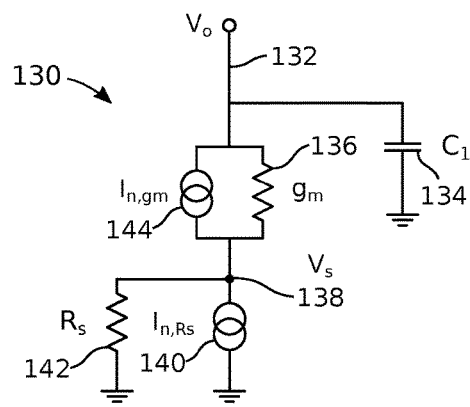
FIG. 7 is a schematic diagram of the voltage-sensed, current-driven circuit supporting the derivation of a noise transfer function.

FIG. 7 is a schematic diagram of the voltage-sensed, current-driven circuit supporting the derivation of a noise transfer function. The model 130 comprises switch transconductance 136, denoted by $g_m$, a switch noise current source 144 denoted by $I_n, g_m$, capacitance $C_1$ 134, a signal current source $I_S$ 140, and source resistance (Rs), represented schematically by source resistor $R_S$ 142. The voltage $V_S$ at the input to the switch is identified with reference designator 138. Finally, the output voltage $V_O$ 132 is taken from the same side of a switch as capacitor 134.

The voltage noise transfer function of the voltage-mode S/H is $V_O/V_{n,gm} = g_m/(g_m + sC_1)$, which is a first-order lowpass function.

$$I_{n,Rs} + I_{Rs} = I_{n,gm} + I_{gm}$$

If $1/R_S \ll g_m => I_{n,Rs} + I_{Rs} \approx 0$ $$I_{C1} = I_{n,gm} - I_{gm}$$

$$I_{C1} = V_O * sC_1$$

$$V_O * sC_1 = I_{n,gm} - V_O * g_m$$

$$I_{n,gm} = V_O * (g_m + sC_1)$$

$$I_{n,gm} = V_{n,gm} * g_m$$

$$V_{n,gm} * g_m = V_O * (g_m + sC_1)$$

$$V_O/V_{n,gm} = g_m/(g_m + sC_1)$$

FIG. 8 is a graph contrasting two noise transfer functions. The lowpass graph (sections 152 and 158) is associated with a voltage-mode circuit. It is flat until the pole frequency of $f_P$. Then it rolls-of due to its pole. A highpass graph is associated with a current-mode circuit. Its response 154 increases until the pole frequency of $f_P$. Then it flattens due to its pole (section 156). Practically, however, two poles are present at $f_P$. Therefore, the current-mode noise transfer 160 rolls-off similarly to the voltage-mode circuit (section 158).

For a voltage-driven circuit both transfer functions for signal and noise are the same:

$$V_O/V_S = g_m/(g_m + sC_1) \quad V_O/V_{n,gm} = g_m/(g_m + sC_1)$$

In order to calculate the total thermal noise contribution certain assumptions need to be made:

1) We calculate only the ½ of the total bandwidth, exactly to the pole position and not beyond to be comparable with the current-driven circuit that takes the same bandwidth.

2. We use an approximation that $1/R_S \ll g_m$, which results in much simpler transfer function. Hence:

$$(V_O/V_{n,gm})^2 = |H(j\omega)|^2 = |g_m^2/(g_m^2 + \omega^2 C^2)| = |1/(1 + \omega^2 C^2/g_m^2)|$$

In order to calculate the bandwidth, we need to integrate $|H(j\omega)^2|$ from 0 to 1. 1 corresponds to $\omega_P = g_m/C$, which is the pole frequency.

$$\int_0^1 d\omega/(1 + \omega^2 C^2/g_m^2) = g_m/C \int_0^1 dx/(1 + x^2) =$$

$$(g_m/C) * \arctan|_0^1 = (g_m/C) * (\pi/4 - 0) = (g_m/C) * (\pi/4)$$

Hence:

$$V^2(f)_{noise} = 4kT * (1/g_m) * BW(\omega) * (1/2\pi) = 4kT * (1/g_m) * (g_m/C) *$$

$$(\pi/4) * (1/2\pi)$$

$$= 4kT * (1/C) * (1/8) = kT/2C.$$

This can be further converted to: $kT/2C = (kT\omega)/(2g_m)$.

For the current-driven circuits of FIG. 1A or 1B, the transfer function for signal is LP (lowpass) and the transfer function for noise is HP (highpass):

$$I_O/I_S = g_m/(g_m + sC_1) \quad I_O/I_n = sg_mC_1/(g_m + sC_1)$$

In order to calculate the total thermal noise contribution certain assumptions need to be made:

3) We calculate only the ½ of the total bandwidth, exactly to the pole position and not beyond to be comparable with the voltage-sensed circuit that takes the same bandwidth.

4) We use the approximation that $1/R_S \ll g_m$, which results in much simpler transfer function.

5) The combined transfer function for noise has the equation:

$$sg_mC/(g_m + sC)^2.$$

Hence:

$$|H(j\omega)^2| = |(\omega C)^2 g_m^2/(g_m^2 + \omega^2 C^2)^2| = [(\omega C)^2 (g_m^2/g_m)^4]/[(1 + \omega^2 C^2/g_m^2)^2]$$

$$= (C^2/g_m^2) * (\omega)^2 / [(1 + \omega^2 C^2/g_m^2)^2]$$

In order to calculate the bandwidth, we need to integrate $|H(j\omega)^2|$ from 0 to 1. 1 corresponds to $\omega_P = g_m/C$, which is the pole frequency.

$$(C^2/g_m^2) * \int_0^1 \omega^2 d\omega/[(1 + \omega^2 C^2/g_m^2)^2] = g_m/C(C^2/g_m^2)(g_m/C^2)) \int_0^1 x^2 dx/(1 + x^2)^2$$

$$= (g_m/C) * \{1/2[-x/(1 + x^2) + \arctan(x)]\}|_0^1$$

$$= (g_m/C) * [1/2((-1/(1 + 1) + \pi/4 - 0)$$

$$= (g_m/C) * (\pi/8 - 1/4).$$

Hence, $$I^2(f)_{noise} = 4kT * g_m * BW(\omega) * (1/2\pi)$$

$$= 4kT * g_m * (g_m/C) * (\pi/8 - 1/4) * (\pi/2) * (1/2\pi)$$

$$= 0.1427 * kT/C * \omega^2.$$

This can be further converted to: $0.1427 * kT/C * \omega^2 = 0.1427 * kT * \omega * g_m$.

In order to compare the noise performance for both circuits, the total thermal noise contributions are divided:

Voltage-driven circuit: $V^2(f)_{noise}=(kT\omega)/(2g_m)$.

This can be converted into current:
$I^2(f)_{noise}=kT\omega*g_m/2$.

Current-driven circuit: $I^2(f)_{noise}=0.1427*kT*\omega*g_m$.

Hence, the improvement can be calculated as a ratio:

$(kT\omega*g_m/2)/0.1427*kT*\omega*g_m=0.5/0.1427=3.5$, or in dBs: $10 \log_{10}(3.5)=5.445$ dB$\approx$5.4 dB.

In some aspects the total noise improvement may reach 10 dB or more. This can be explained as follows. Practical modern MOS devices have a significant 1/f noise contribution. In current deep-submicron CMOS technologies the 1/f noise corner can be anywhere from 10 MHz to 100 MHz.

Figure 9:
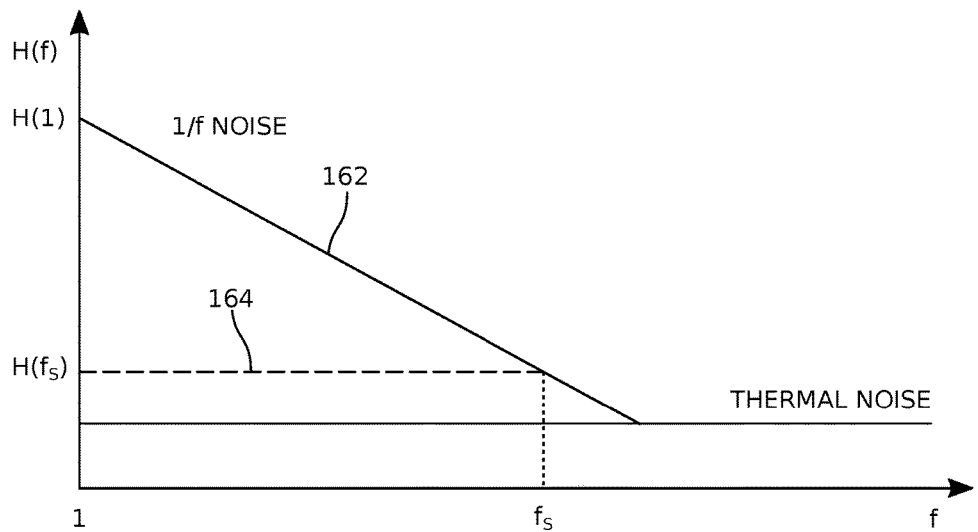
FIG. 9 is a first graph showing two principles of 1/f noise handling.

FIG. 9 is a first graph showing two principles of 1/f noise handling. The solid line 162 is associated with to a voltage-mode circuit that integrates 1/f (flicker) noise until the sampling frequency of $f_S$. The result of this integration is $b^2/3$, where $b^2=H(1)^2$. The dashed line 164 is associated with a current-mode circuit. Because of its highpass noise transfer it integrates a flat spectrum until $f_S$. The result of this integration is $b^2/f_S$. The ratio of these two integrations gives a 1/f noise improvement of current-mode over voltage-mode circuitry, which is calculated to be $f_S/3$.

Referring to FIGS. 8 and 9, it can be seen that with a voltage-driven circuit provides no help for the suppression of 1/f noise. This is a result of lowpass (LP) noise characteristics that pass all 1/f noise to the output. This can be represented graphically (see the FIGS. 8 and 9), or numerically as follows.

$|I_1(f)|^2=a^2/(f)^2/[1+(2\pi)^2 f^2 C^2_1/g^2_m]\approx a^2/(f)^2$ for $f<g_m/(2\pi C_1)$ For an ideal current-driven circuit with zero at the origin the 1/f noise is flattened, meaning there is no high noise value at f=0, and then a linear drop-off until the 1/f corner.

$|I_2(f)|^2=a^2/BW^2$ for $f<g_m/(2\pi C_1)$

The spectrum starts from zero Hertz and it is flat. Hence, after integration the residuum 1/f noise looks like a thermal noise.

Calculating the integrals in both cases, BW=10 MHz and BW$<g_m/(2\pi C_1)$.

Voltage Case:

$S^2_1(f)=a^2*\int^1_{BW} df/f^2=a^2/3*/f^3|^1_{BW}=a^2/3*[1-1/(BW)^3]\approx a^2/3$, where $a^2=1/f$ noise power value for $f=1$ Hz, or $|I_1(1)^2|=a^2$ Current Case:

$$S_2^2(f) = a^2 * \int_1^{BW} (df/f^2)*(C^2/g_m^2)*(2\pi f)^2/[(1+(2\pi f)^2 C^2/g_m^2)^2]$$

$$\approx a^2 \int_1^{BW} C^2/g_m^2(2\pi)^2 df$$

$$= (a^2/BW^2)*f\,|_1^{BW} = (a^2/BW^2)*[BW-1]$$

$$\approx (a^2/BW^2)*BW = a^2/BW$$

$S_1^2(f)/S_2^2(f) = (1/3)*BW = 3.33*10^6$, or $10\log_{10}(3.33*10^6) \approx 65.2$ dB Theoretically, the total 1/f noise improvement is 65 dB. However, this result is not always practical.

Figure 10:
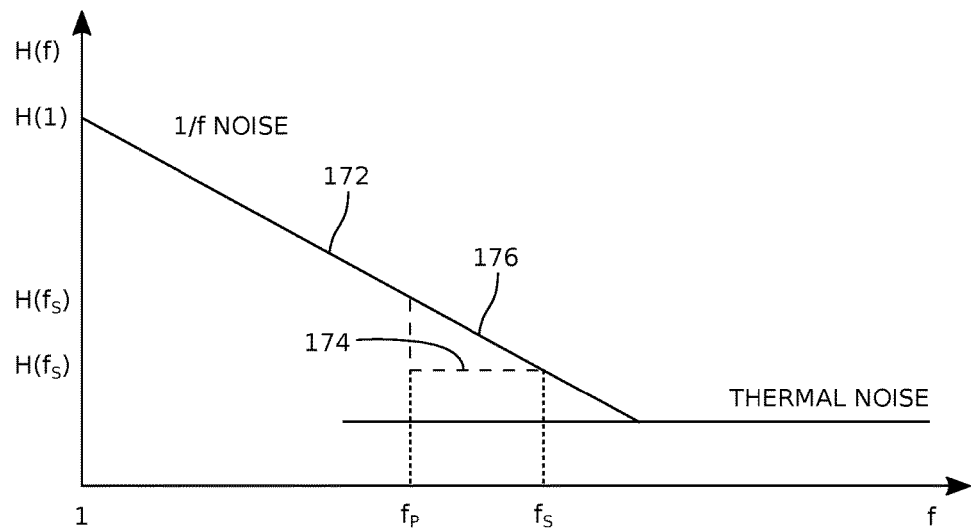
FIG. 10 is a second graph showing two principles of 1/f noise handling.

FIG. 10 is a second graph showing two principles of 1/f noise handling. The solid line 172 is associated with a voltage-mode circuit, which integrates 1/f noise until the sampling frequency of $f_S$. Between a corner frequency $f_P$ and sampling frequency $f_S$, the graph portion is identified by the numeral 176 and is still of 1/f type. A flat spectrum identified by the numeral 174 is associated with a current-mode circuit. Due to the highpass (HP) characteristics of the current-mode circuit, from a corner frequency $f_P$ to a sampling frequency $f_S$, the dashed-line graph portion identified by reference designator 174 is flat. That is, to compare the two circuits an intermediate frequency point $f_P$ is taken into account. At this frequency the current-mode circuit regains its highpass noise transfer function. As a result, between $f_P$ and $f_S$, the voltage-mode circuit integration noise is $c^2/3$, where $c^2=H(f_P)^2$, and a current-mode circuit integration noise 174 is $c^2/(f_S-f_P)$. The ratio of these two integrals gives the 1/f noise improvement of current-mode over voltage-mode circuitry. In this case, it is calculated to be $(f_P-f_S)/3$.

For simplicity, an assumption that $1/R_S<<g_m$ is used. If this assumption is not used the current-mode noise transfer is not highpass at dc (zero Hertz), but it is flat and then becomes highpass from a certain frequency. For example, if this corner is at 1 megahertz (MHz), then for first 1 MHz the current-driven circuit behaves like a voltage-driven circuit. But at 1 MHz the HP behavior starts and for next 1 decade until 10 MHz, the 1/f noise remains flat. The perceived advantage is around 4.8 dB.

$S^2_3(f)=(b^2/3)[1-1/(10-1)^3]=(b^2/3)[1-\frac{1}{9}^3]$ $\approx b^2/3$ for voltage-mode circuit.

$S^2_4(f)=b^2/(10-1)=b^2/9$ for current-mode circuit.

$S^2_3(f)/S^2_4(f)=(b^2/3)/(b^2/9)=3$, or $10 \log_{10}(3)\approx 4.8$ dB, see FIG. 10.

So, the total improvement should be around 5.4 dB for a flat thermal noise and 4.8 dB for i/f noise, totaling 10.2 dB.

Figure 11:
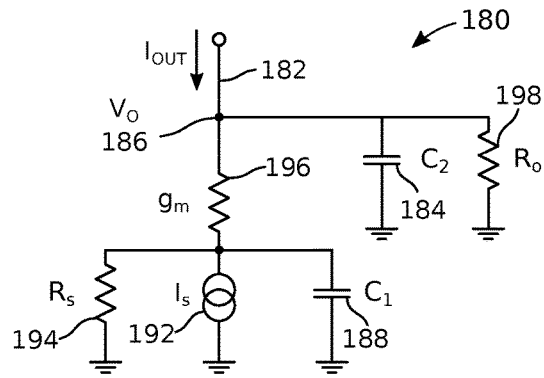
FIG. 11 is the schematic diagram of FIG. 2 featuring the addition of a second capacitor for steeper noise roll-off.

FIG. 11 is the schematic diagram of FIG. 2 featuring the addition of a second capacitor for steeper noise roll-off. The model 180 includes output current $I_O$ 182, output capacitor $C_2$ 184, the output voltage $V_O$ on line 186, switch transconductance 196, input resistance (Rs), represented schematically as resistor $R_S$ 194, input current source $I_S$ 192, source voltage $V_S$ 190, output resistance (Ro), represented schematically as resistor $R_O$ 198, and input capacitor $C_1$ 188.

$V_O = -R_O*I_O$, $I_S = I_{Rs} + I_{C1} + I_{gm} = V_S*(1/R_S+g_m+sC_1) - V_O*g_m - I_O$ $= I_{C2} + I_{gm} = V_O*(sC_2+g_m) - V_S*g_m$ $= R_O*I_O*(sC_2+g_m) - V_S*g_m$ $I_S = V_S*(1/R_S+g_m+sC_1) + R_O*I_O*g_m = > V_S$ $= I_O*[R_O(sC_2+g_m)+1]/g_m$ where Ro represents the resistance value of Ro; and, where $C_2$ represents the capacitance value of $C_2$.

$$I_S = \{I_O * [R_O(sC_2 + g_m) + 1]/g_m\} * (1/R_S + g_m + sC_1) + R_O * I_O * g_m$$
$$= (I_O/g_m) * [R_O(sC_2 + g_m) + 1] * (1/R_S + sC_1) + (I_O/g_m) *$$
$$[R_O(sC_2 + g_m) + 1] * g_m + R_O * I_O * g_m$$
$$= (I_O/g_m) * [R_O(sC_2 + g_m) + 1] * (1/R_S + sC_1) + I_O * (sR_O C_2 + 1) =$$
$$(I_O/g_m) * [sC_2 R_O/R_S + g_m R_O/R_S + 1/R_S + s^2 R_O C_1 C_2 +$$
$$sg_m R_O C_1 + sC_1] + I_O/g_m * (sg_m R_O C_2 + g_m)$$

$$I_O/I_S = g_m/[(sC_2 R_O/R_S + g_m R_O/R_S + 1/R_S + s^2 R_O C_1 C_2 +$$
$$sg_m R_O C_1 + sC_1) + (sR_O C_2 + 1)]$$
$$= g_m/[s^2 R_O C_1 C_2 + s(C_2 R_O/R_S + g_m R_O C_1 + C_1 + g_m R_O C_2) +$$
$$g_m R_O/R_S + 1/R_S + g_m]$$

Since $R_O$ is high, then $g_m * R_O \gg 1$. In some aspects $g_m * R_O > 10$ hence, $$I_O/I_S \approx g_m/[s^2 R_O C_1 C_2 + sg_m R_O(C_1 + C_2) + g_m R_O/R_S]$$
$$= (g_m/R_O C_1 C_2)/[s^2 + sg_m(C_1 + C_2)/C_1 C_2 + g_m/R_S C_1 C_2]$$

$$\omega_O^2 = g_m/R_S C_1 C_2,$$

$$\omega_O/Q = g_m(C_1 + C_2)/C_1 C_2 \sqrt{(g_m/R_S C_1 C_2)/O}$$
$$= g_m(C_1 + C_2)/C_1 C_2$$

$$Q = \sqrt{(g_m/R_S C_1 C_2)/g_m(C_1 + C_2)/C_1 C_2} = \sqrt{(C_1 C_2/g_m R_S)/(C_1 + C_2)}$$

$$Q = C/2C = 0.5, g_m \approx R_S, \omega_O = 1m/10p = 1*10^8 = > f_O = 15.9 \text{ MHz.}$$

Figure 12:
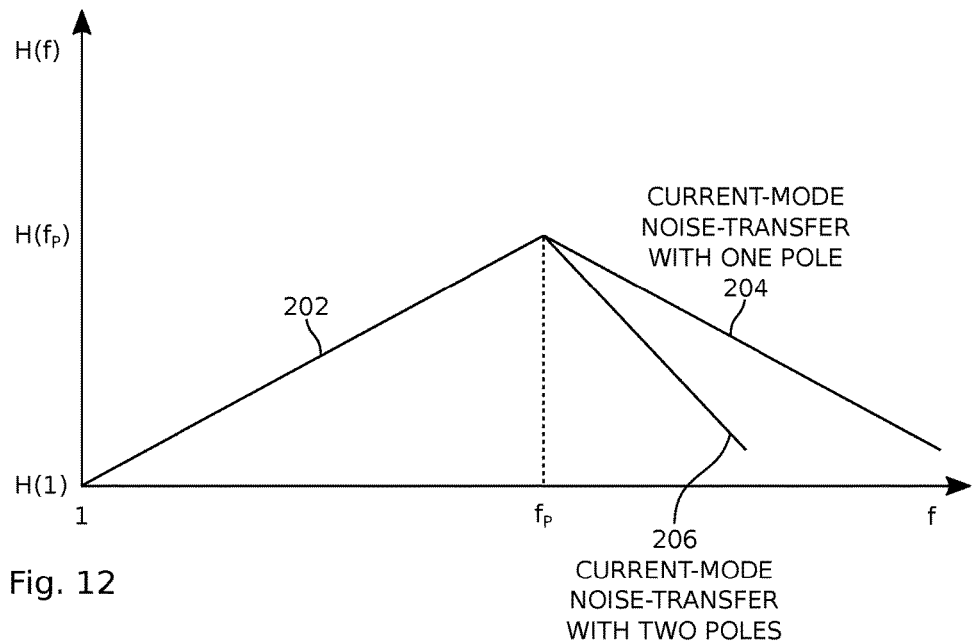
FIG. 12 is a graph depicting two noise transfer functions for the current-sensed, current-driven S/H circuit.

FIG. 12 is a graph depicting two noise transfer functions for the current-sensed, current-driven S/H circuit. The high-pass portion 202 increases until the pole frequency of $f_P$. Then it rolls-of due to its poles. Two cases are possible. One is when only one input capacitor $C_1$ is present, with one real pole 204. In the second case two capacitors, the input $C_1$ and the output $C_2$, are present, with two complex poles 206. Thus, with the second capacitor the HP transfer has not one-real pole, but two complex poles giving it a preferred steeper −40 dB per decade roll-off, instead of 20 dB per decade a roll-off.

It should be noted that for $g_m \approx R_S$ and for $C_1 = C_2$ the Q=0.5 is low. The system is critically dumped. It demonstrates no overshoot and fast response. However, even with such a low Q the roll-off is 40 dB per decade and not 20 dB per decade as in the case of a system with one capacitor. The noise improvement can be calculated as follows:

For a one pole roll-off with $f_P = 10$ MHz, the integrated noise from 10 MHz to 100 MHz is:

$$(I_O/I_{n,gm})^2| = |1/(1 + \omega^2 C^2/g_m^2)|$$
$$= |1/(1 + (2\pi)^2 f^2 C^2/g_m^2)| \approx (2\pi)^2 * (C/g_m)^2/f^2$$

$$S_5^2(f) = \int_{10*f_P}^{f_P} (2\pi)^2 * (C/g_m)^2 * df/f^2$$
$$= (1/3) * (1/2\pi) * (g_m/C)/f^3 |_{f_P*10}^{f_P}$$
$$= (1/3) * (1/2\pi) * (g_m/C) * (1 - 1/(10-1)^2)$$
$$\approx (1/3) * f_P$$

$$S_6^2(f) = \int_{10*f_P}^{f_P} (2\pi)^2 * (C/g_m)^2 * df/f^4 = (1/5) * (1/2\pi) *$$
$$(g_m/C)/f^5 |_{f_P*10}^{f_P}$$
$$= (1/5) * (1/2\pi) * (g_m/C) * (1 - 1/(10-1)^4)$$
$$\approx (1/5) * f_P$$

$$S_5^2(f)/S_6^2(f) = (1/3) * f_P/(1/5) * f_P = 5/3 = > 10 * \log_{10}(5/3) = 2.2 \text{ dB.}$$

In summary, the current-mode S/H circuit performance can be summarized as follows:

1. The total thermal noise improvement is 5.4 dB, if we just drive and sense the circuit with current instead of voltage.

2. Much more performance gain is achieved when a true 1/f noise characteristic for the switches is considered. Because the current-mode circuit has a HP noise transfer, it cancels 1/f noise low frequency component. If the HP starts at dc the noise improvement may reach 65 dB or more.

3. However, in practical circuits it is expected that the HP starts not at dc-, but at higher frequency, so that the low end is not compensated. However, some performance improvement due to 1/f noise cancellation always exists. For a just a decade of HP noise transfer function, another 4.8 dB is gained. Then the total circuit noise improvement (thermal and 1/f) is close to 10.2 dB.

4. Finally, adding second capacitor—$C_2$ in the current-mode circuit results in a faster roll-off. The noise improvements depend on the circuit parameters, but for a typical case they are calculated to be 2.2 dB. Hence, the total circuit noise improvement may reach 12.4 dB.

5. In some aspects the current-mode circuit may have as much as 10 dB lower noise as compared to a voltage-mode, which is well within the reach due to a 2 dB margin.

A current-mode S/H circuit has been presented. Modification of the circuit may become apparent in those of ordinary skill in the art upon reading the present disclosure, and it is intended that the scope of the invention disclosed herein be limited only by the broadest interpretation of the appended claims to which the inventor is legally entitled.

I claim:

1. A sample-and-hold circuit with an enhanced noise limit, the sample-and-hold circuit comprising:
   a first field effect transistor (FET) having a first source drain (S/D) to accept an analog input signal current ($I_S$), a second S/D, and a gate to accept a binary level first digital control signal;
   second FET having a second S/D connected to the first S/D of the first FET, a first S/D connected to the second S/D of the first FET, and a gate to accept a binary level second digital control signal, complementary to the first digital control signal;
   a source resistance (Rs) between the first S/D of the first FET and ground;
   a first capacitor ($C_1$) having a first terminal connected to the first S/D of the first FET, and a second terminal connected to ground; and,
   wherein the second S/D of the first FET presents a current-sensed analog output signal ($I_O$) in response to the first and second digital control signals respectively enabling the first and second FETs at a first time.

2. The sample-and-hold circuit of claim 1 wherein the combination of the first FET, second FET, source resistance, and first capacitor create a lowpass current signal transfer function.

3. The sample-and-hold circuit of claim 2 wherein the lowpass current signal transfer function is represented as follows:

$$I_O/I_S = g_m/(g_m + sC_1);$$

where s is a complex frequency=$j\omega$;
where j is an imaginary unit;
where $\omega = 2 \cdot \pi \cdot$frequency;
where $C_1$ represents the capacitance value of $C_1$; and,
where $g_m$ is the transconductance of the first and second FETs.

4. The sample-and-hold circuit of claim 3 wherein the combination of the first FET, second FET, source resistance, and first capacitor create a highpass noise transfer function.

5. The sample-and-hold circuit of claim 4 wherein the highpass noise transfer function is represented as follows:

$$(I_O/I_{n,gm}) = sg_m C_1/(g_m + sC_1); \text{ and,}$$

where $I_{n,gm}$ is a switch noise current source associated with the first and second FETs.

6. The sample-and-hold circuit of claim 5 wherein a combined noise transfer function, derived from the lowpass current transfer function ($I_O/I_S$) and highpass noise transfer function ($I_O/I_{n,gm}$) is represented as follows:

$$(I_O/I_{n,gm}) \cdot (I_O/I_S) = sg_m C_1/(g_m + sC_1)^2.$$

7. The sample-and-hold circuit of claim 6 wherein the combination of the first FET, second FET, source resistance, and first capacitor create a flat spectrum flicker (1/f) noise response from the first and second FET corner frequency ($f_P$) to a sampling frequency ($f_S$), when $1/R_S$ is at least an order of magnitude less than $g_m$.

8. The sample-and-hold circuit of claim 6 wherein the combination of the first FET, second FET, source resistance, and first capacitor create a flat thermal noise ($I(f)_{noise}$) response from the first and second FET corner frequency ($f_P$) to a sampling frequency ($f_S$), when $1/R_S$ is at least an order of magnitude less than $g_m$.

9. The sample-and-hold circuit of claim 8 wherein $$I^2(f)_{noise} = 0.1427 \cdot kT \cdot g_m;$$

where k is the Boltzmann constant; and,
where T is the Kelvin temperature.

10. The sample-and-hold circuit of claim 1 further comprising:

a second capacitor ($C_2$) having a first terminal connected to the second S/D of the first FET and a second terminal connected to ground.

11. The sample-and-hold circuit of claim 10 further comprising:

an output resistance ($R_O$) between the second S/D of the first FET and ground;

wherein the combination of the first FET, second FET, source resistance, output resistance, first capacitor, and second capacitor create a lowpass current signal transfer function represented as follows:

$$I_O/I_S = (g_m/R_O C_1 C_2)/[s^2 + sg_m(C_1 + C_2)/C_1 C_2 + g_m/R_S C_1 C_2], \text{ where } g_m \cdot R_O \text{ is at least greater than 10;}$$

where s is a complex frequency=$j\omega$;
where j is an imaginary unit;
where $\omega = 2 \cdot \pi \cdot$frequency;
where $C_1$ represents the capacitance value of $C_1$;
where $C_2$ represents the capacitance value of $C_2$; and,
where $g_m$ is the transconductance of the first and second FETs.

12. A sample-and-hold circuit with an enhanced noise limit, the sample-and-hold circuit comprising:

at least a first field effect transistor (FET) having a first source drain (S/D) to accept an analog input signal current ($I_S$), a second S/D, and a gate to accept a binary level first digital control signal;

a source resistance ($R_S$) between the first S/D of the first FET and ground;

a first capacitor ($C_1$) having a first terminal connected to the first S/D of the first FET and a second terminal connected to ground;

a second capacitor having a first terminal connected to the second S/D of the first FET and a second terminal connected to ground; and, wherein the second S/D of the first FET presents a current-sensed analog output signal ($I_O$) in response to the first digital control signal enabling the first FET at a first time.

13. The sample-and-hold circuit of claim 12 further comprising:

an output resistance ($R_O$) between the second S/D of the first FET and ground;

wherein the combination of the first FET, source resistance, output resistance, first capacitor, and second capacitor create a lowpass current signal transfer function represented as follows:

$$I_O/I_S = (g_m/R_O C_1 C_2)/[s^2 + sg_m(C_1 + C_2)/C_1 C_2 + g_m/R_S C_1 C_2], \text{ when } g_m \cdot R_O \text{ is at least greater than 10;}$$

where s is a complex frequency=$j\omega$;
where j is an imaginary unit;
where $\omega = 2 \cdot \pi \cdot$frequency;
where $C_1$ represents the capacitance value of $C_1$;
where $C_2$ represents the capacitance value of $C_2$; and,
where $g_m$ is the transconductance of the first FET.

* * * * *

UNITED STATES PATENT AND TRADEMARK OFFICE
CERTIFICATE OF CORRECTION

PATENT NO. : 10,291,226 B1  
APPLICATION NO. : 16/143654  
DATED : May 14, 2019  
INVENTOR(S) : Adam Vishinsky Page 1 of 1

It is certified that error appears in the above-identified patent and that said Letters Patent is hereby corrected as shown below:

In the Specification

In Column 5, Line 57, two separate formulas have been so closely positioned so as to appear as if they are one formula, the formulas should be printed as follows:
$V_O/V_S = g_m/(g_m + sC_1)$    $V_O/V_{n,gm} = g_m/(g_m + sC_1)$ In Column 6, Line 22, two separate formulas have been so closely positioned so as to appear as if they are one formula, the formulas should be printed as follows:
$I_O/I_S = g_m/(g_m + sC_1)$    $I_O/I_n = Sg_mC_1/(g_m + sC_1)$ Signed and Sealed this  
Eighteenth Day of June, 2019

Andrei Iancu  
*Director of the United States Patent and Trademark Office*